(12) United States Patent
Cho et al.

(10) Patent No.: US 7,709,834 B2
(45) Date of Patent: May 4, 2010

(54) ORGANIC THIN FILM TRANSISTOR SUBSTRATE AND METHOD OF MANUFACTURING THE SAME

(75) Inventors: Seung Hwan Cho, Hwaseong-si (KR); Keun Kyu Song, Gyeonggi-do (KR); Min Ho Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 340 days.

(21) Appl. No.: 11/828,971

(22) Filed: Jul. 26, 2007

(65) Prior Publication Data

US 2008/0023697 A1 Jan. 31, 2008

(30) Foreign Application Priority Data

Jul. 28, 2006 (KR) .................. 10-2006-0071236

(51) Int. Cl.
*H01L 35/24* (2006.01)
*H01L 51/00* (2006.01)

(52) U.S. Cl. .................. 257/40; 257/59; 257/72; 257/E51.001

(58) Field of Classification Search .................. 257/40, 257/E51.001; 438/99
See application file for complete search history.

(56) References Cited

U.S. PATENT DOCUMENTS 7,253,848 B2 * 8/2007 Wong et al. .................. 349/43
7,456,912 B2 * 11/2008 Wong et al. .................. 349/43
2005/0263755 A1 * 12/2005 Kang et al. .................. 257/40
2008/0001142 A1 * 1/2008 Cho et al. .................. 257/40
2008/0017851 A1 * 1/2008 Choi et al. .................. 257/40
2008/0023695 A1 * 1/2008 Cho et al. .................. 257/40

FOREIGN PATENT DOCUMENTS

| JP | 2005-0354051 A | 12/2005 |
| JP | 2006-066294 A | 3/2006 |
| KR | 10-2005-023012 A | 3/2005 |

* cited by examiner

*Primary Examiner*—Eugene Lee
*Assistant Examiner*—Anthony Ho
(74) *Attorney, Agent, or Firm*—Innovation Counsel LLP

(57) ABSTRACT

The present invention provides an organic thin film transistor substrate and a method of manufacturing the same capable of uniformly forming the thickness of a gate insulating layer and a protective layer and preventing overflow of an organic semiconductive layer.

The organic thin film transistor according to the present invention comprises a gate line formed on a substrate; a data line which intersects the gate line with an organic gate insulating layer interposed therebetween to define a pixel area; a thin film transistor connected with the gate line and the data line and which includes an organic semiconductive layer; a pixel electrode connected with the thin film transistor and formed in the pixel area; an organic protective layer formed parallel with the gate line to cover the organic semiconductive layer and its peripheral area; a first border insulating layer stepwise formed so that the organic gate insulating layer and the protective layer are filled, and a second border insulating layer formed on the source electrode and the drain electrode of the thin film transistor so that the organic semiconductive layer is filled.

10 Claims, 13 Drawing Sheets

ORGANIC THIN FILM TRANSISTOR SUBSTRATE AND METHOD OF MANUFACTURING THE SAME

This application claims priority to Korean Patent Application No. 2006-0071236 filed on Jul. 28, 2006 (entitled: "Organic thin Film Transistor Substrate and Method of Manufacturing the Same") and all the benefits accruing therefrom under 35U.S.C. §119, and the disclosure of which is incorporated herein by reference.

BACKGROUND

1. Field of Invention

The present disclosure of invention relates to thin film transistor substrates such as used in flat panel displays and to a method of manufacturing such thin film transistor substrates. More particularly, the present disclosure relates to an organic thin film transistor (oTFT) substrate and a method of manufacturing the organic thin film transistor substrate in a manner capable of uniformly defining a thickness of a gate insulating layer and of a protective layer and of preventing or reducing overflow of an organic semiconductive layer which is used to form one or more oTFT's.

2. Description of Related Art

In general, liquid crystal displays ("LCDs") display an image in such a way that liquid crystal containing cells arranged on a liquid crystal panel in a matrix selectively adjust light transmittance therethrough in accordance with supplied video signals.

Each liquid crystal cell includes a thin film transistor ("TFT") used as a switching element for selectively supplying video signals to one or more charge-storing capacitor plates of that cell. An active layer of the TFT is conventionally composed of an amorphous-Si or a polycrystalline-Si.

Since the amorphous-Si or a poly-Si active layer is conventionally patterned and formed by one or more of a thin film deposition (coating) process, a photolithography process, and an etching process, there have been several problems including that the process tends to become complex and manufacturing costs rise.

Recently, research and development have focused on instead using an organic thin film transistor (oTFT) formed from an active layer comprising an organic semiconductive material which may be formed by a printing process.

Such an organic semiconductive layer of the organic thin film transistor (oTFT) typically needs to be protected by a protective layer which may be formed within a hole prepared in a border-defining insulating layer. Further, a gate line and a data line connected with the organic thin film transistor cross with each other and have a gate insulating layer interposed between them. Conventionally, an edge portion and a center portion of each of a gate insulating layer and a protective layer have different thickness, thereby generating an undesirable appearance of a spot at the point where the disparate thicknesses occur in unison. Further, a conventional organic semiconductive layer is not formed within a hole prepared by a border-defining insulating layer and thus the conventional organic semiconductor material tends to overflow out of the conventional containment hole.

SUMMARY

The present disclosure of invention provides an organic thin film transistor substrate and a method of manufacturing the same capable of uniformly forming the thickness of a gate insulating layer and a protective layer and preventing overflow of an organic semiconductive layer out of a corresponding containment hole. A number of different, border-defining and electrically insulative structures will be described herein where a side wall and/or a major surface of the structure provides a separation or containment border of one kind or another. For sake of brevity, the word, "border" may be generally used here alone in place of "border-defining" and it will be understood that border-defining is intended in such contexts.

An organic thin film transistor substrate according to the present disclosure comprises a gate line formed on a substrate; a data line which intersects the gate line and has an organic gate insulating layer interposed therebetween to define a pixel area; a thin film transistor connected with the gate line and the data line and which includes an organic semiconductive layer; a pixel electrode connected with the thin film transistor and formed in a sub-pixel area of the substrate; an organic protective layer formed parallel with the gate line to cover the organic semiconductive layer and its peripheral areas; a first border-defining insulating layer that is stepwise formed so that the organic gate insulating layer and the organic protective layer may be formed by filling in liquid precursor materials into the stepwise defined containment hole, and a second border-defining insulating layer that is formed on the source electrode and on the drain electrode of the thin film transistor so as to further define a materials containment hole into which a liquid precursor of the organic semiconductive layer is filled.

Herein, the first border insulating layer comprises a first border insulating sub-layer which defines a first containment hole formed to extend in parallel with the gate line so that material of the organic gate insulating layer may be filled into the first containment hole; and a second border insulating sub-layer which defines a second containment hole formed to continue from the first containment hole and formed so that material of the organic protective layer may be filled into the second containment hole.

In one embodiment, the first border insulating layer may be formed of an organic layer containing one or more fluorine groups provided selectively at surface areas thereof.

In one embodiment, an area exposed by the first containment hole has a hydrophilic property with the organic gate insulating layer, and a remaining area has a hydrophobic property with the organic gate insulating layer.

Further in one embodiment, an area exposed by the second containment hole has a hydrophilic property with the organic protective layer, and a remaining area has a hydrophobic property with the organic protective layer.

Herein, a channel area of the thin film transistor exposed by the second border insulating layer has a hydrophilic property with the organic semiconductive layer, and a remaining area has a hydrophobic property with the organic semiconductive layer.

Meanwhile, the source electrode and the drain electrode comprise a first conductive layer formed of a transparent conductive layer, and at least one layer of second conductive layer formed on the first conductive layer in a remaining area except for an area overlapping a gate electrode of the thin film transistor.

The data line may be formed by extending the first conductive layer of the source electrode or depositing the first conductive layer and the second conductive layer, and the pixel electrode may be formed by extending the first conductive layer of the drain electrode.

At this time, the second border insulating layer may be formed to have the same width as that of the second conductive layer on the second conductive layer or to be wider than the width of the second conductive layer.

The second border insulating layer may be formed of a photosensitive organic layer.

Meanwhile, the gate electrode and the gate line may be formed of at least double-stacked conductive layer including a transparent conductive layer, and the pixel electrode may be formed of the transparent conductive layer on the same plain as that of the gate electrode and the gate line.

A method of manufacturing an organic thin film transistor substrate according to the present invention comprises forming a gate line and a gate electrode connected with the gate line on the substrate; stepwise forming a first border insulating layer having a first interconnect hole and a second interconnect hole which exposes the gate electrode; forming an organic gate insulating layer to be filled within the first border insulating layer; forming a data line intersecting the gate line, a source electrode connected with the data line, a drain electrode facing the source electrode, a pixel electrode connected with the drain electrode, and a second border insulating layer formed on the source electrode, the drain electrode, and the data line; forming an organic semiconductive layer constituting a channel between the source electrode and the drain electrode within an area prepared by the first border insulating layer and the second border insulating layer; and forming an organic protective layer within the second interconnect hole to cover the organic semiconductive layer and its peripheral area.

Herein, the forming of the first border insulating layer comprises forming a first sub-border insulating layer which prepares the first interconnect hole, and a second sub-border insulating layer which prepares the second interconnect hole connected with the first interconnect hole to have the width wider than that of the first interconnect hole.

The forming of the data line, the source electrode, the drain electrode, and the second border insulating layer comprises sequentially forming a first conductive layer formed of a transparent conductive layer on a substrate on which the organic gate insulating layer may be formed, and a second conductive layer formed of at least one opaque metal; forming a stepped structure of the second border insulating layer on the second conductive layer; forming the data line and the source/drain metal patterns including the source electrode and the drain electrode, and the pixel electrode on the first border insulating layer by patterning the first conductive layer and the second conductive layer using as a mask the second border insulating layer; exposing the second conductive layer of the pixel electrode and the second conductive layer of the source electrode and the drain electrode of the channel by ashing the second border insulating layer; and removing the second conductive layer exposed.

BRIEF DESCRIPTION OF THE DRAWINGS

The above and other features of the present disclosure will become more apparent by describing exemplary embodiments thereof with reference to the accompanying drawings, in which.

DETAILED DESCRIPTION

Figure 1:
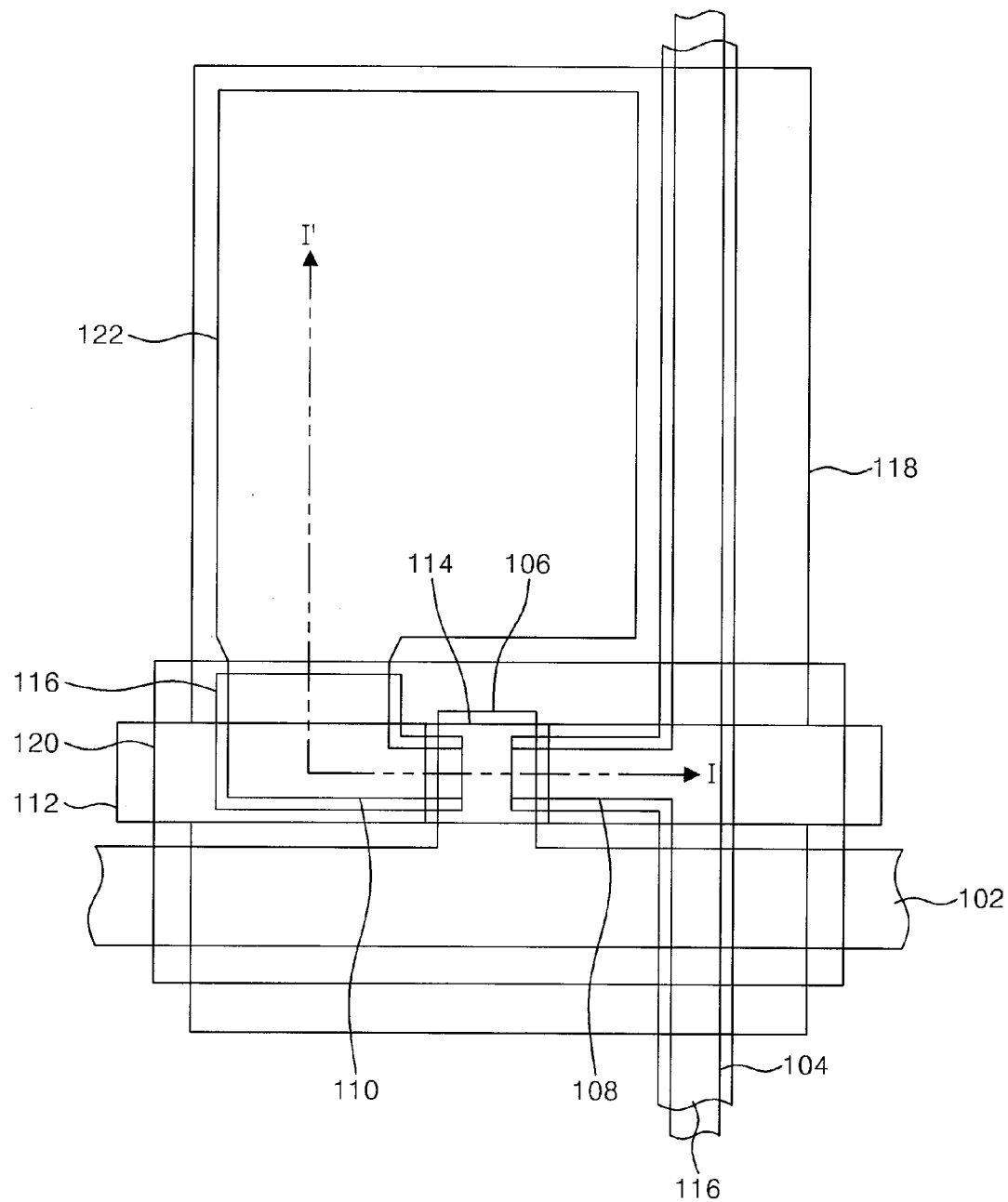
FIG. 1 is a plan view showing an organic thin film transistor substrate in accordance with an exemplary embodiment.
Figure 2:
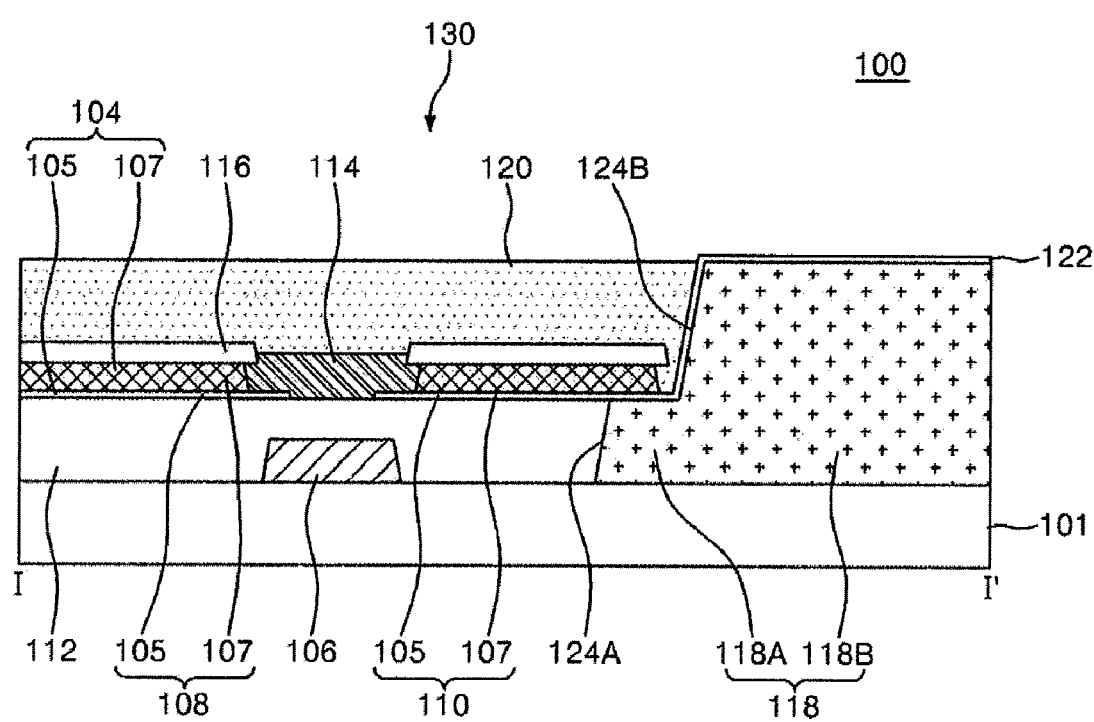
FIG. 2 is a cross-sectional view taken along line I-I' of the organic thin film transistor substrate shown in FIG. 1.

FIG. 1 is a plan view showing a substrate 100 that includes an organic thin film transistor (oTFT) 130 in accordance with an exemplary embodiment of the present disclosure and FIG. 2 is a cross-sectional view taken along line I-I' of the organic thin film transistor substrate shown in FIG. 1.

The thin film transistor substrate 100 shown in FIGS. 1 and 2 comprises a horizontally-extending gate line 102 and a vertically-extending data line 104 formed to cross with each other. The substrate 130 further comprises a first border-defining insulating layer 118 disposed a lower substrate layer 101, where the first border layer 118 has defined therein a lower materials containment hole 124A and an upper materials containment hole 124B. An organic thin film transistor (oTFT) 130 is formed in a pixel area corner portion near where the gate and data lines 102, 104 cross. A light-passing pixel electrode 122 is formed over at least part of the pixel area and is structured to operatively connect with a drain portion 110 of the thin film transistor 130.

The gate line 102 supplies a scan or select signal from a gate driver circuit (not shown). The data line 104 supplies a pixel data signal from a data driver circuit (not shown). The gate line 102 and the data line 104 bound two adjacent sides of, and thereby define a pixel area. An organic gate insulating layer 112 is interposed between the gate and data lines at least at their crossing points.

The data line 104 may be formed of a single conductive layer such as a transparent conductive layer disposed on the organic gate insulating layer 112. Alternatively the data line 104 may be formed as at least a double-stacked set of conductive layers including a transparent conductive layer. For example, the data line 104 may be formed of a double layer having a first conductive layer 105 being a transparent conductive layer and a second conductive layer 107 using an opaque metal. The first conductive layer 105 may be composed of at least one of ITO, TO, IZO, ITZO, etc. and the second conductive layer 107 may be formed of a single metal layer such as for example, Cu, Mo, Al, Cu alloy, Mo alloy, Al alloy, etc. which may have a lower resistance than that of the first conductive layer 105, or at least double-stacked layer using the metal materials such as Mo/Al/Mo.

The thin film transistor 130 selectively passes a pixel signal, which is supplied from the data line 104 where the selective passing is responsive to a scan signal supplied to the gate line 102. The selectively passed pixel signal is charged onto and stored by the pixel electrode 122. For doing so, the thin film transistor 130 comprises a gate electrode 106 connected with the gate line 102, a source electrode 108 connected with the data line 104, a drain electrode 110 spaced apart from the source electrode 108 and connected with the pixel electrode 122, and an organic semiconductive layer 114 overlapping the gate electrode 106 and having a portion of the organic gate insulating layer 112 interposed between the gate 106 and the active layer 114 so as to thereby form a gate-controlled channel region disposed between the source electrode 108 and the drain electrode 110.

The gate electrode 106 extends into a first containment hole 124A (lower hole 124A). A border of the first containment hole 124A is defined by a lower ledge portion 118A of the first border insulating layer 118. The source and drain electrodes 108, 110 may be formed of a first conductive layer 105 that is deposited over the channel area and etched to create a spacing between the source and drain electrodes. A second conductive layer 107 may be deposited overlapping the transparent first conductive layer 105 so as to provide reduced resistance in areas that do not need to pass light through such as in the area of data line 104. The organic semiconductive layer 114 may be deposited on the organic gate insulating layer 112 in an area bounded by the first border insulating layer 118 and further bounded by a second border insulating layer 116 as will be described shortly. The organic semiconductive layer 114 makes contact at opposed sides thereof with the source and drain electrodes 108, 110.

The organic semiconductive layer 114 may be formed of an organic semiconductive material, such as, for example, pentacene, tetracene, anthracene, naphthalene, α-6T, α-4T, perylene, and derivative thereof, rubrene and derivative thereof, coronene and derivative thereof, perylene tetracarboxylic diimide and derivative thereof, perylenetetracarboxylic dianhydride and derivative thereof, phthalocyanine and derivative thereof, naphthalene tetracarboxylic diimide and derivative thereof, naphthalene tetracarboxylic dianhydride and derivative thereof, conjugated polymer derivative containing a substituted or non-substituted thiophene, conjugated polymer derivative containing a substituted fluorine, etc.

The organic semiconductive layer 114 may develop ohmic-contact with its adjacent source and drain electrodes 108, 110, respectively, by way of a Self Assembled Monolayer (SAM) treatment process. More specifically, a difference of work functions that naturally exists between each of the source and drain electrodes 108, 110 and the organic semiconductive layer 114 may be reduced by use of the SAM treatment process. The SAM treatment creates a situation where holes can be easily injected into P-type material of the organic semiconductive layer 114 at the interface with the metallic source and drain electrodes 108, 110 so that contact resistance between each of the source and drain electrodes 108, 100 and the organic semiconductive layer 114 is reduced.

The thin film transistor 130 is protected at its top by an organic protective layer 120. The organic protective layer 120 may be formed to extend in parallel with the horizontal gate line 102 and to fill into the upper containment hole 124B, where the latter is defined by an upper ledge portion 118B of the border insulating layer 118. The upper and lower ledge portions 118B and 118A of the first border insulator 118 may combine as shown in FIG. 2 to define a step like sidewall border that contains the organic gate dielectric 112 in the lower, narrower part 124A of the containment hole and that contains the organic protective layer 120 in the upper wider part 124B of the containment hole. In this way, the organic protective layer 120 formed within the upper portion 124B of the containment hole may be formed to cover not only the top of the thin film transistor 130 but also its peripheral side areas. In particular, the organic protective layer 120 may be formed to cover an interface between each of the source and drain electrodes 108, 110 and the organic semiconductive layer 114. Accordingly, layer 120 may prevent damage to the organic semiconductive layer 114 by humidity penetrating into the interface between each of the source and drain electrodes 108, 110 and the organic semiconductive layer 114 or by a chemical solution, etc. used in a manufacturing process. Further, an ink-jet printing apparatus may be used for depositing the organic protective layer 120 into the upper containment hole 124B. The shape of the upper containment hole 124B provides the ink-jet printing process with a wider process margin than that of a conventional organic protective layer formed by a one-diameter dot unit to cover only the thin film transistor 130, thereby simplifying a manufacturing process.

The first border insulating layer 118 is stepwise formed so as to define the lower and upper containment holes 124A, 124B as having sidewalls running substantially parallel with the gate line 102. In other words, the first border insulating layer 118 comprises the lower border defining sub-layer 118A that is formed to define a border portion of the lower containment hole 124A in every pixel area where the lower containment hole 124A is bounded on its bottom by the lower substrate layer 101. The first border insulating layer 118 further comprises the upper border defining sub-layer 118B that is formed to be thicker than the thickness of the lower sub-layer 118A and is used to define a border portion of the upper containment hole 124B. Herein, a first sidewall area exposed by the lower containment hole 124A has a hydrophilic property so as to resist whetting thereof by the organic protective layer 120, and a remaining sidewall area has a hydrophobic property so as to encourage whetting thereof by the organic protective layer 120. The upper containment hole 124B may be formed to connect with the lower containment hole 124A and to be wider than the width of the lower containment hole 124A.

The second border insulating layer 116 may be formed of a photosensitive organic insulating layer and used as a mask pattern when the data line 104, the source electrode 108, and the drain electrode 110 are defined by etching or otherwise. In this case, the second border insulating layer 116 may be formed to be wider than the width of the second conductive layer 107 on the second conductive layer 107 of the source and drain electrodes 108, 110 and the data line 104. The second border insulating layer 116 prevents the organic semiconductive layer 114 formed by an ink-jet printing method from flowing over the metal portions 107 of the source/drain electrodes and thus making uncontrolled contact with the pixel electrode 122. Herein, a top portion of the second border insulating layer 116 has a hydrophilic property at least in its region near the transistor channel so as to resist whetting thereat by the organic semiconductive layer 114 and a remaining area of the second border insulating layer 116 has a hydrophobic property so as to encourage whetting therewith by the organic semiconductive layer 114. Accordingly, when a liquid form of the organic semiconductive layer 114 is deposited into the cavity bounded source/drain electrodes 108, 110 and by the second border insulating layer 116, the liquid form of organic semiconductive layer 114 is encouraged to remain within the interior of this cavity and not to spread outwardly over the hydrophilic tops of the second border insulating layer 116.

The pixel electrode 122 may be formed by extending the material of the first conductive layer 105 (which is a transparent conductive sub-layer portion of the drain electrode 110) up along the banked sidewall of the upper sub-layer 118B of the first border insulating layer 118 for each pixel area. Further, if the gate electrode 106 and the gate line 102 are each formed of at least a double-stacked set of conductive layers including a transparent conductive layer, then the pixel electrode 122 may be formed instead of the same transparent conductive sub-layer material used for the gate electrode 106 and the gate line 102.

When the pixel electrode 122 receives a video signal voltage passed through the organic thin film transistor 130, the pixel electrode forms an electric field with an overlying but spaced-apart common electrode (not shown). The common electrode receives a common voltage. The difference between the voltages on the pixel-electrode and the common electrode can change alignment of liquid crystal molecules disposed between the thin film transistor substrate and a color filter substrate so that polarization of passing through light is rotated in accordance with an anisotropy dielectric constant. The amount of light that transmits through the pixel area can vary according to the degree of rotation of the liquid crystal molecules and can thus be made different, thereby implementing a gray scale or a color of varying intensity.

Figure 3A:
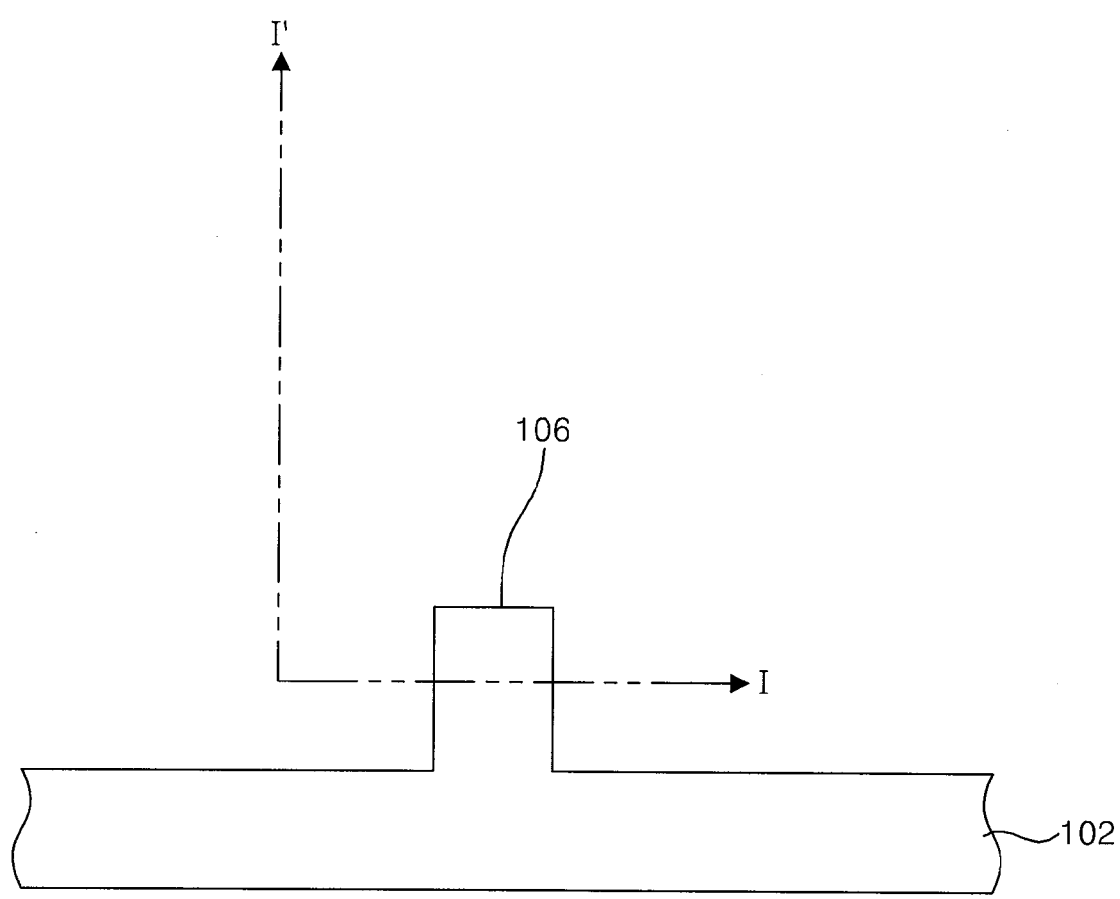
FIGS. 3A and 3B are a plan view and a cross-sectional view for illustrating a method of manufacturing a gate metal pattern shown in FIGS. 1 and 2.
Figure 3B:
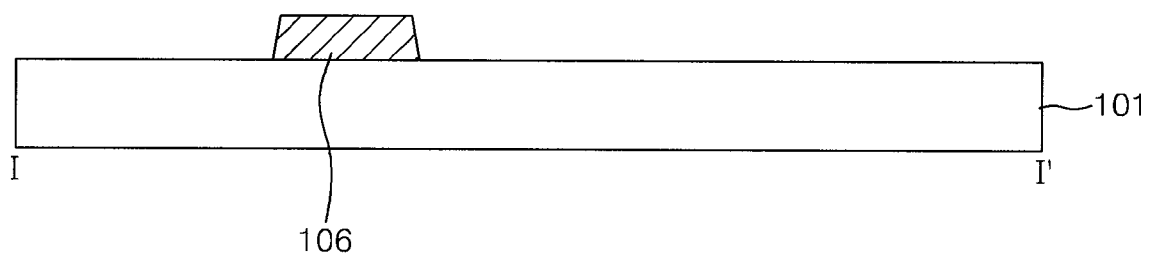

A method of manufacturing the structure of FIGS. 1 and 2 will now be detailed. FIGS. 3A and 3B are respectively a plan view and a cross-sectional view showing a gate metal pattern including the gate line 102 and the gate electrode 106, which pattern may be formed by a first mask process applied to a metal layer deposited on the lower substrate 101.

More specifically, the gate metal layer is deposited on the lower substrate 101, and then the gate metal layer is patterned by a photolithography process and an etching process to form the illustrated gate metal pattern including the gate line 102 and the gate electrode 106. Herein, the gate metal layer may be formed of a single layer such as a metal layer, for example, Mo, Ti, Cu, AlNd, Al, Cr, Mo alloy, Cu alloy, Al alloy, etc., or at least double-stacked layer having the metal materials.

Figure 4A:
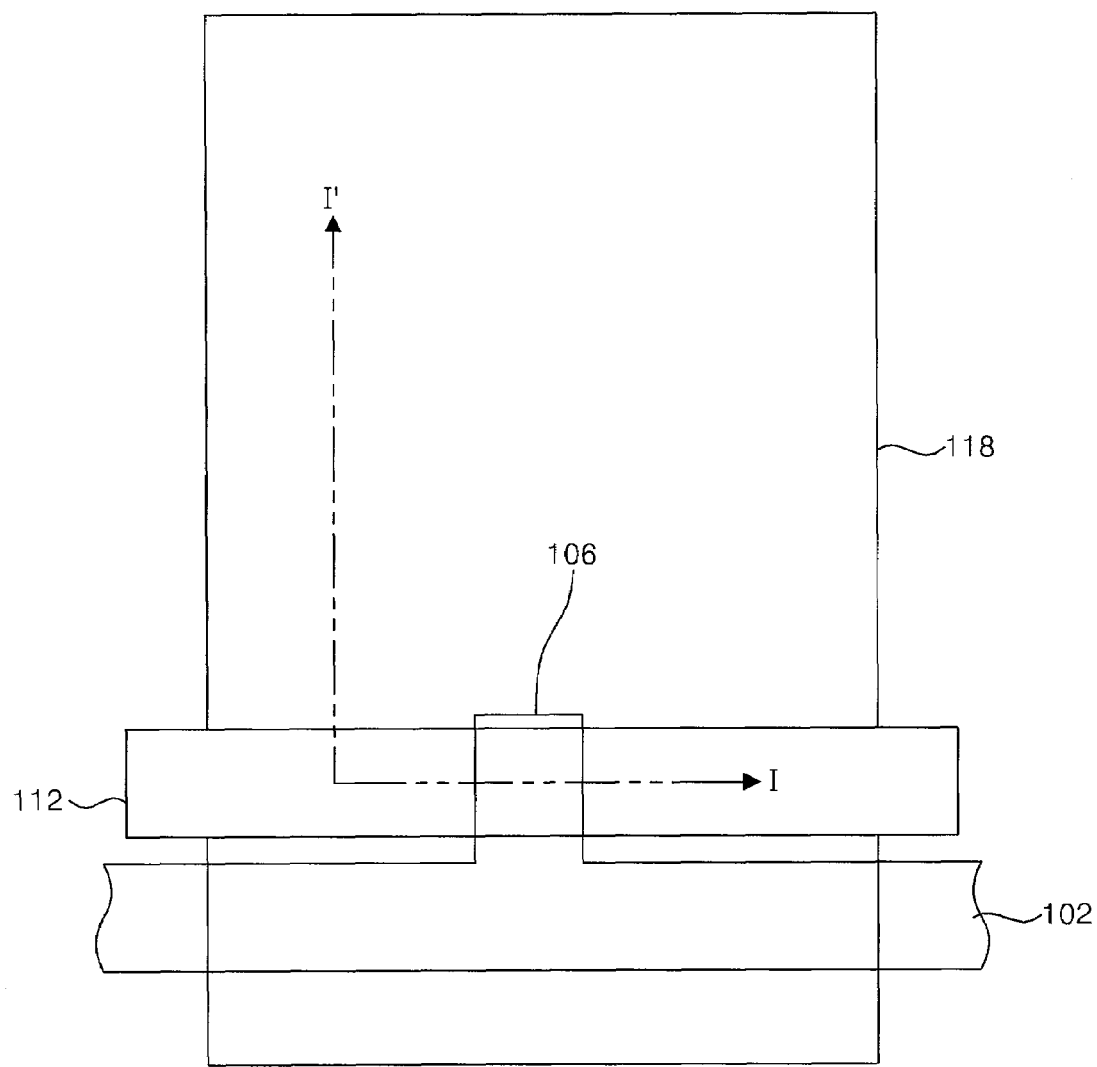
FIGS. 4A and 4B are a plan view and a cross-sectional view for illustrating a method of manufacturing a first border insulating layer and an organic gate insulating layer shown in FIGS. 1 and 2.
Figure 4B:
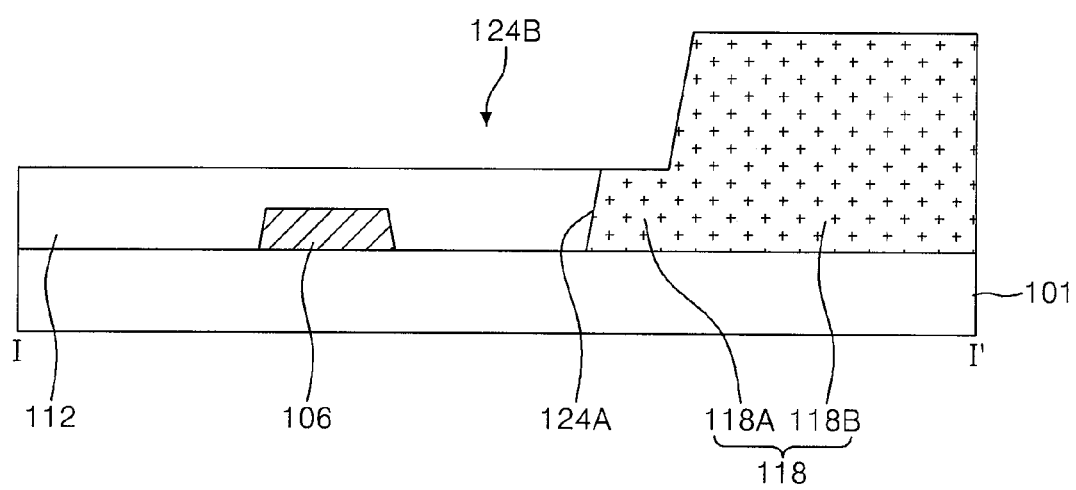

FIGS. 4A and 4B are respectively a plan view and a cross-sectional view for illustrating a method of manufacturing the first border insulating layer 118 and defining the organic gate insulating layer 112 of one embodiment.

As shown in FIGS. 4A and 4B, the first border insulating layer 118 is formed to include the lower and upper insulating sub-layers 118A, 118B on the lower substrate layer 101. The gate metal pattern 120/106 is also formed on the lower substrate layer 101. The organic gate insulating layer 112 may be formed within the first containment hole 124A whose border is defined at least in part by the first border insulating layer 118. In this regard, a method will now be described in detail with reference to FIGS. 5A to 5C for how to define the double ledged cross sectional shape of the first border insulating layer 118.

Figure 5A:
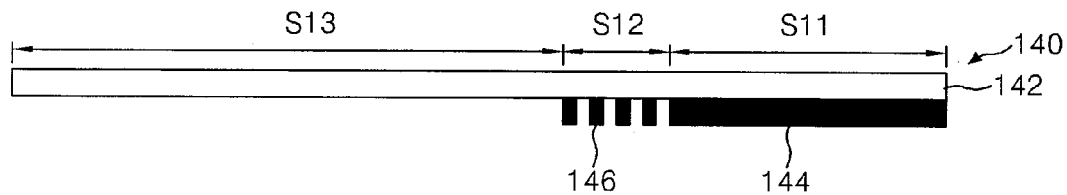
FIGS. 5A to 5C are cross-sectional views for illustrating a method of manufacturing the first border insulating layer and the organic gate insulating layer shown in FIG. 4B.
Figure 5A:
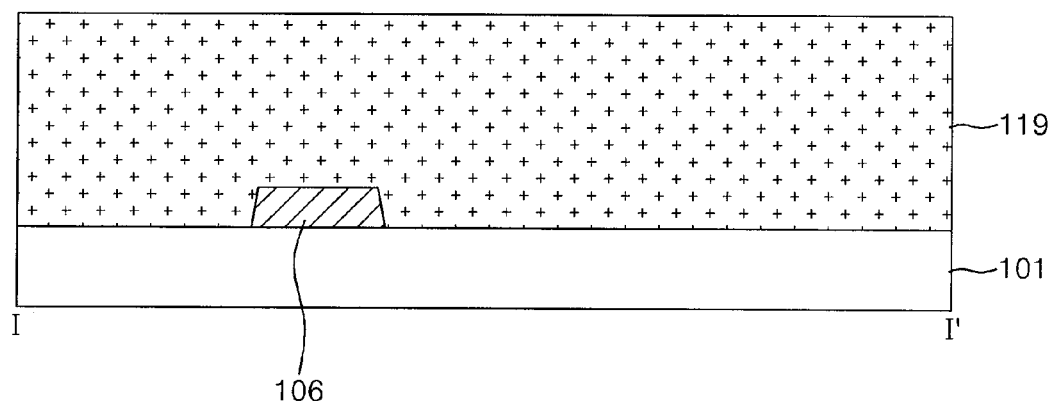
Figure 5B:
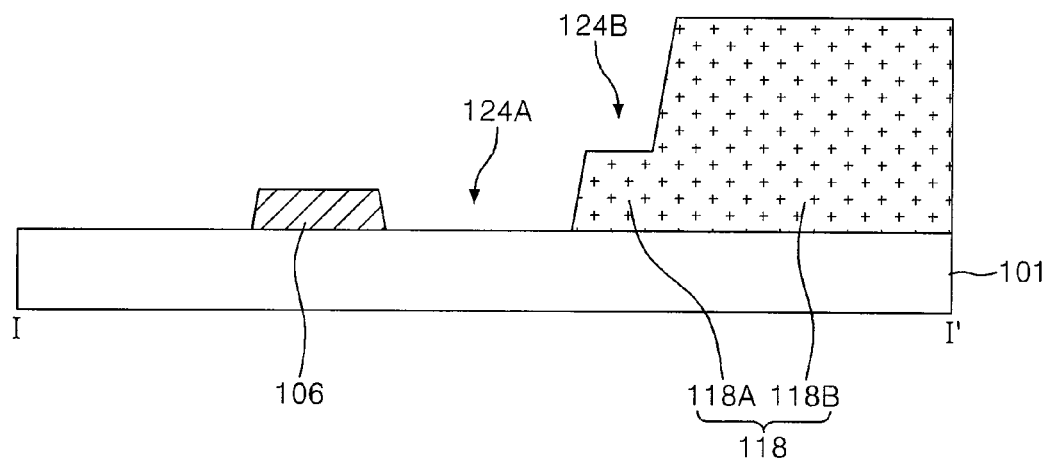
Figure 5C:
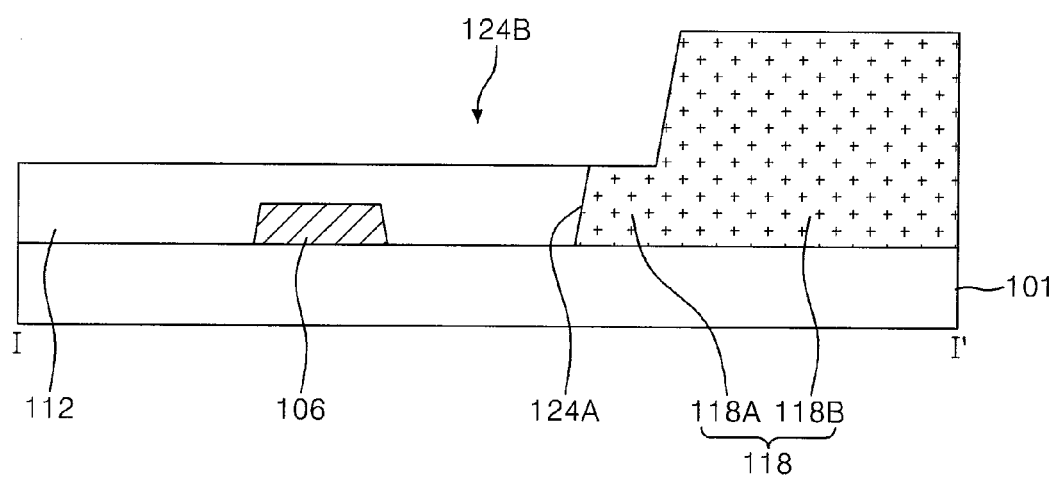

As shown in FIG. 5A, a photosensitive organic insulating material 119 is deposited by a coating method such as a Spinless Coating method, a Spin Coating method, etc. on the entire surface of the lower substrate 101 on which the gate metal pattern is preformed. Then, a slit photomask 140 is aligned over the lower substrate 101. The slit mask 140 comprises a full blocking area S11 in which a light blocking layer 144 is formed for example on a quartz substrate 142. The slit mask 140 further comprises a grated or slit area S12 in which partial light blocking slits 146 are formed on the quartz substrate 142. The slit mask 140 further comprises a light transmitting area S13 in which the unblocked quartz substrate 142 exists. The blocking area S11 blocks ultraviolet rays in an exposing process. As a consequence, after a developing process, the upper border insulating sub-layer 118B is formed above the lower substrate 101 in an area corresponding to the full blocking area S11, as shown in FIG. 5B. The diffraction grated or slit area S12 diffracts ultraviolet rays in an exposing process. As a consequence, after a developing process, the lower border insulating sub-layer 118A is formed to be thinner than the thickness of the upper border insulating sub-layer 118B in an area which corresponds to the partial slit area S12, as shown in FIG. 5B. Sidewall borders for the upper containment hole 124B and lower containment hole 124A are thus formed. The transmitting area S13 transmits all of ultraviolet rays in an exposing process. As a consequence, after a developing process, the lower containment hole 124A connects with the upper containment hole 124B in an area which corresponds to the transmitting area S13, as shown in FIG. 5B. Herein, the sidewall of the lower containment hole 124A may be formed to extend parallel with the gate line 102. The lower containment hole 124A may be formed to have a width that is narrower than that of the upper containment hole 124B. Then, as may be seen from FIG. 5C, a liquid organic insulation solution may be introduced into the lower containment hole 124A by way of spraying the solution from an electronically controlled ink-jet printing apparatus for example. The introduced organic insulation solution is then hardened (e.g., cured via heating and or exposure to UV light) to thereby form the organic gate insulating layer 112 that fills the lower containment hole 124A, as shown in FIG. 5C. The organic gate insulating layer 112 may be comprised of one or more of polyvinyl pyrrolidone (PVP), polymethlymethacrylate (PMMA), benzocyclobutene (BCB), polyimide, polyvinylphenol, parylene, etc.

Meanwhile, before spraying or other wise introducing the organic insulation solution of insulating layer 112, in one embodiment, the lower substrate 101, on which the first border insulating layer 118 is formed, is anodized. As a result of the anodizing process, an area exposed by the lower containment hole 124A acquires a hydrophilic property for encouraging whetting by the organic insulation solution, while a remaining area of the organic material retains a hydrophobic property for thereby discouraging whetting by the organic insulation solution. Then, when the organic insulation solution is sprayed on the lower substrate 101, the organic insulation solution is concentrated on the area exposed by the lower containment hole 124A having the hydrophilic property and thus it readily whets with the organic insulation solution to thereby selectively form the organic gate insulating layer 112 in the anodized area. Accordingly, overflow of the organic gate insulating layer 112 may be prevented.

Alternatively or additionally, the first border insulating layer 118 may be formed of a material having a hydrophobic property so as to repel adhesion to or whetting thereof by the organic insulation solution. For example, the first border insulating layer 118 may be formed of an insulating material having a fluorine containing group on its surface (e.g., Teflon™). In this case, when the organic insulation solution is sprayed on the lower substrate 101 on which the first border insulating layer 118 has been formed, the organic insulation solution is concentrated into the area exposed by the lower containment hole 124A to form the organic gate insulating layer 112 therein.

Figure 6A:
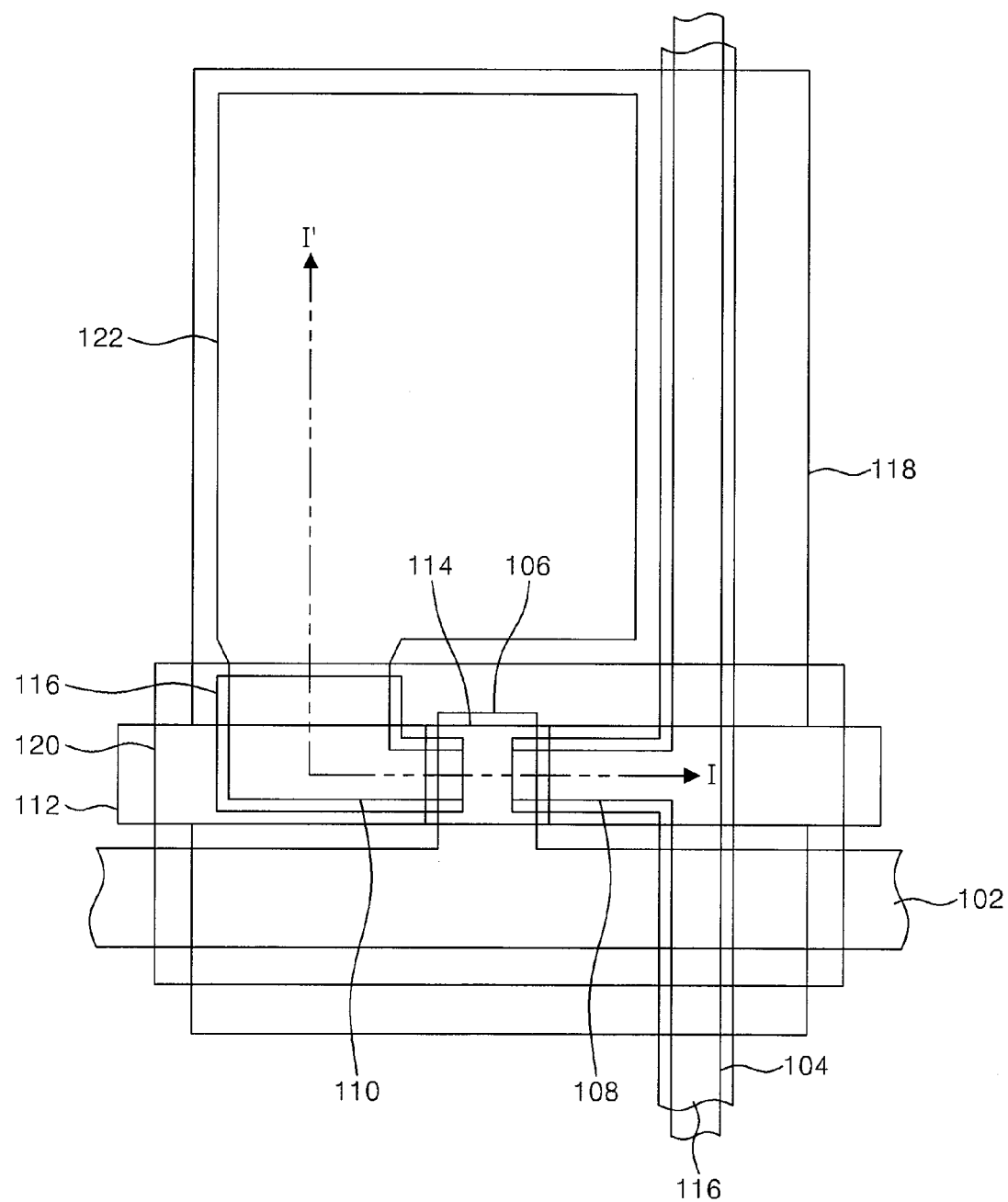
FIGS. 6A and 6B are a plan view and a cross-sectional view for illustrating a method of manufacturing source and drain metal patterns, a pixel electrode, a second border insulating layer, an organic semiconductive layer, and an organic protective layer shown in FIGS. 1 and 2.
Figure 6B:
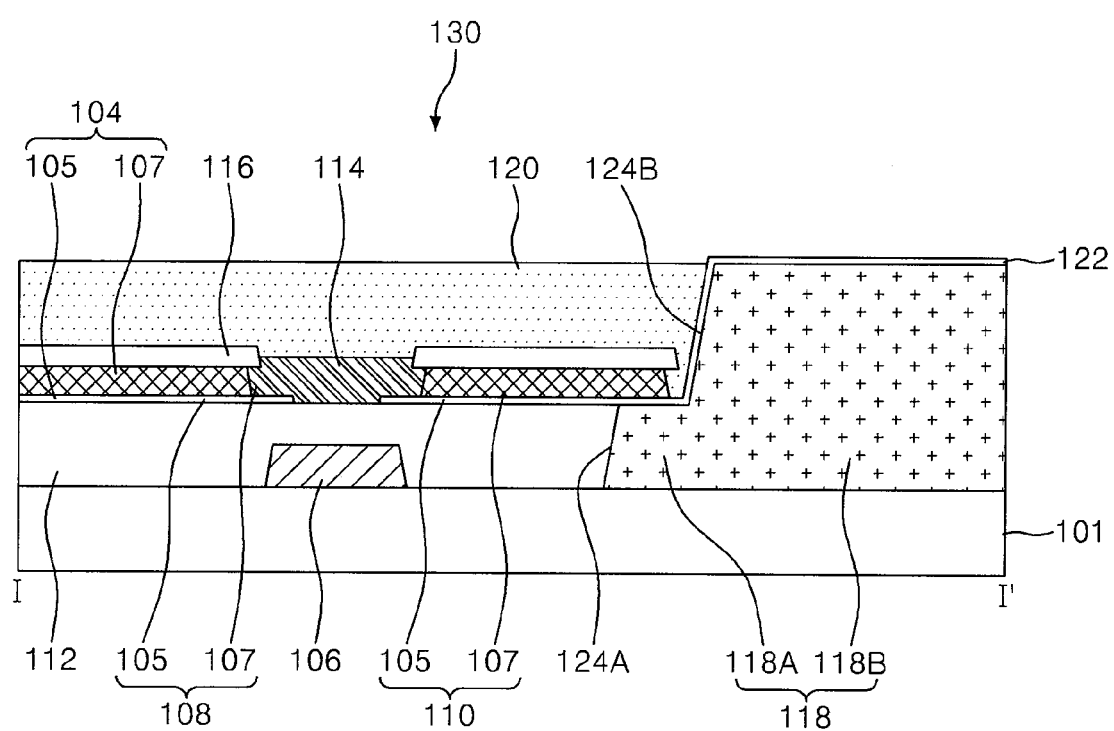

FIGS. 6A and 6B are respectively a plan view and a cross-sectional view for illustrating a method of manufacturing the source and drain metal patterns, the pixel electrode, the second border insulating layer, the organic semiconductive layer, and the organic protective layer.

As shown in FIGS. 6A and 6B, the source and drain metal patterns including the data line 104, the source electrode 108, and the drain electrode 110, the pixel electrode 122, and the second border insulating layer 116 may be formed on the pre-formed and pre-hardened organic gate insulating layer 112. Then the organic semiconductive layer 114 and the organic protective layer 120 are sequentially formed one after the other. In this regard, it will now be described in detail with reference to FIGS. 7A to 7E.

Figure 7A:
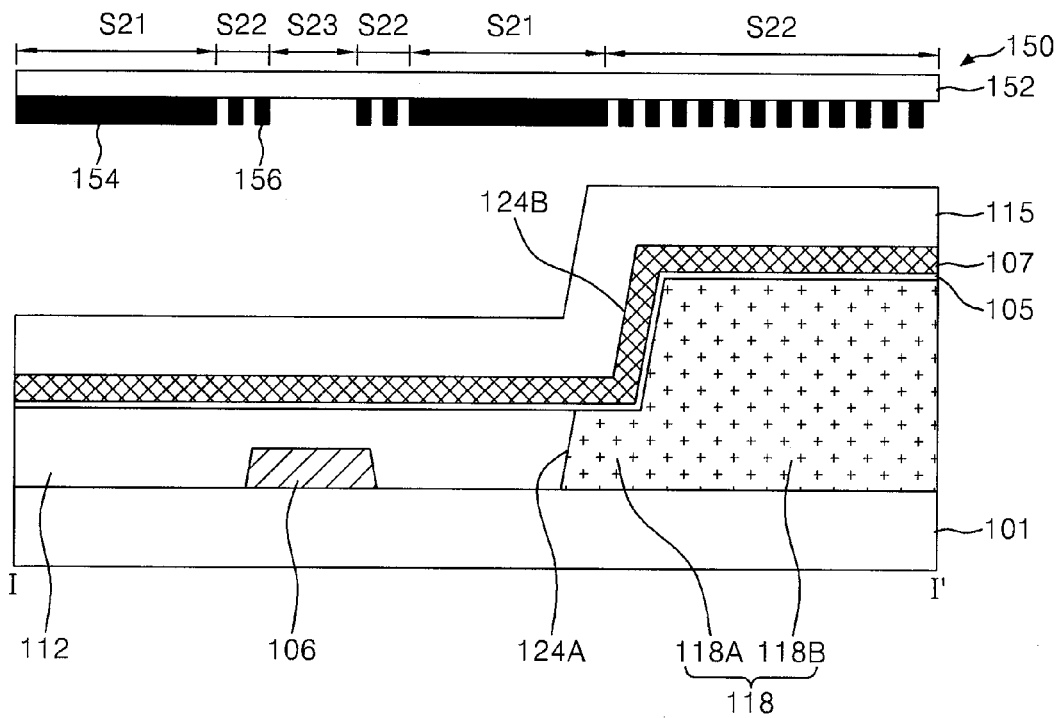
FIGS. 7A to 7E are cross-sectional views for illustrating a method of manufacturing the source and drain metal patterns, the pixel electrode, the second border insulating layer, the organic semiconductive layer, and the organic protective layer shown in FIG. 6B.

As shown in FIG. 7A, the first and second conductive layers 105, 107 are deposited by a deposition method such as a sputtering method, etc. over the preformed organic gate insulating layer 112 and over the preformed first border insulating layer 118. The first conductive layer 105 may be formed of a transparent conductive material, such as, for example, ITO, TO, IZO, ITZO, etc., and the second conductive layer 107 may be formed of a single layer such as a metal layer, for example, Mo, Ti, Cu, AlNd, Al, Cr, Mo alloy, Cu alloy, Al alloy, etc., or at least double-stacked layer having the metal materials.

Then, a photosensitive organic layer 115 such as photoresist or photo acryl resin, etc. may be formed on the second conductive layer 107. Then, the photosensitive organic layer 115 is exposed and developed by a photolithography process using a transflective mask or a slit (grated) mask 150, and then the second border insulting layer 116 having a stepped structure may be formed, as shown in FIG. 7B by developing the pattern of mask 150.

More specifically, the slit mask 150 comprises a blocking are S21 in which a blocking layer 154 may be formed on a quartz substrate 152, a slit area S22 in which slits 156 may be formed on the quartz substrate 152, and a transmitting area S23 in which only the quartz substrate 152 exists. The blocking area S21 is positioned in an area, in which the source electrode, the drain electrode, and the data line will be formed, to block passage of ultraviolet rays in an subsequent exposing process. Then the second border insulating layer 116 having a first thickness h1 may be formed, as shown in FIG. 7B. The slit area S22 may be formed in an area, in which the source and drain electrodes corresponding to a channel area, and the pixel electrode may be formed, to diffract ultraviolet rays in an exposing process, and then after a developing process, the second border insulating layer 116 having a second thickness h2 thinner than the first thickness h1 will be formed, as shown in FIG. 7B. The transmitting area S23 transmits all of ultraviolet rays, and then after a developing process, the photosensitive organic layer 115 is removed, as shown in FIG. 7B to leave behind the illustrated material of the second border insulating layer 116.

An aniosotropic reactive ion etching process (RIE) or the like is then used to remove thinly masked portions of the first and second conductive layers 105, 107 and relatively thin portions of the second border insulating layer 116 as a mask. This leaves behind the source and drain metal patterns including the data line 104, the source electrode 108, and the drain electrode 110, and the pixel electrode 122 as shown in FIG. 7B.

Figure 7B:
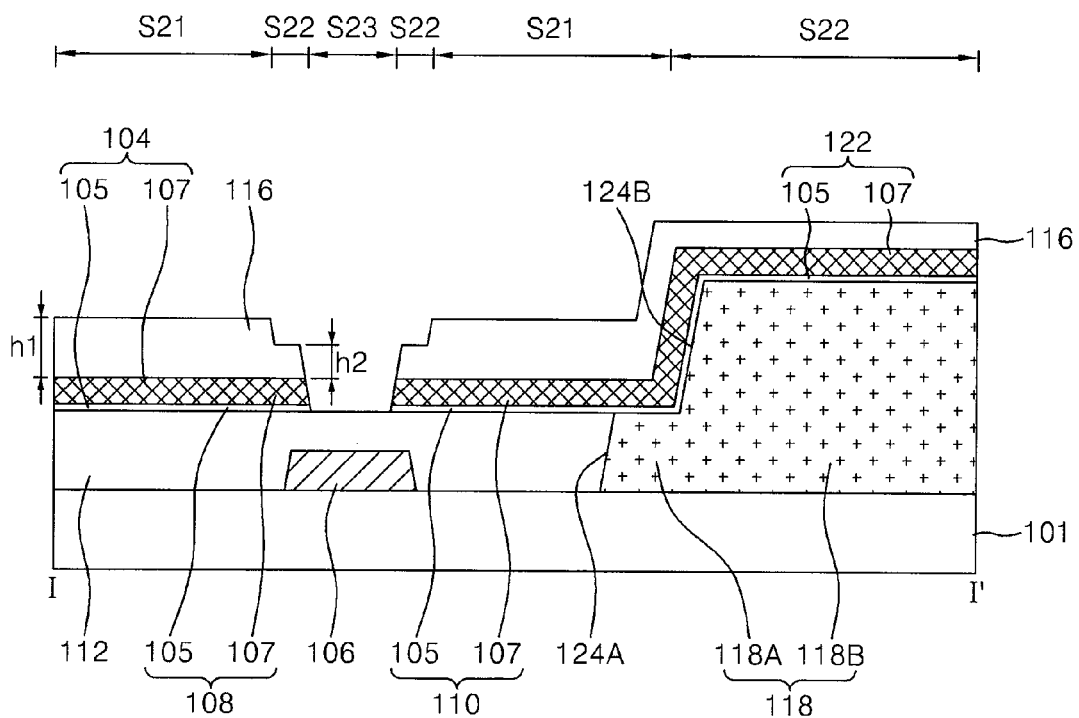
Figure 7C:
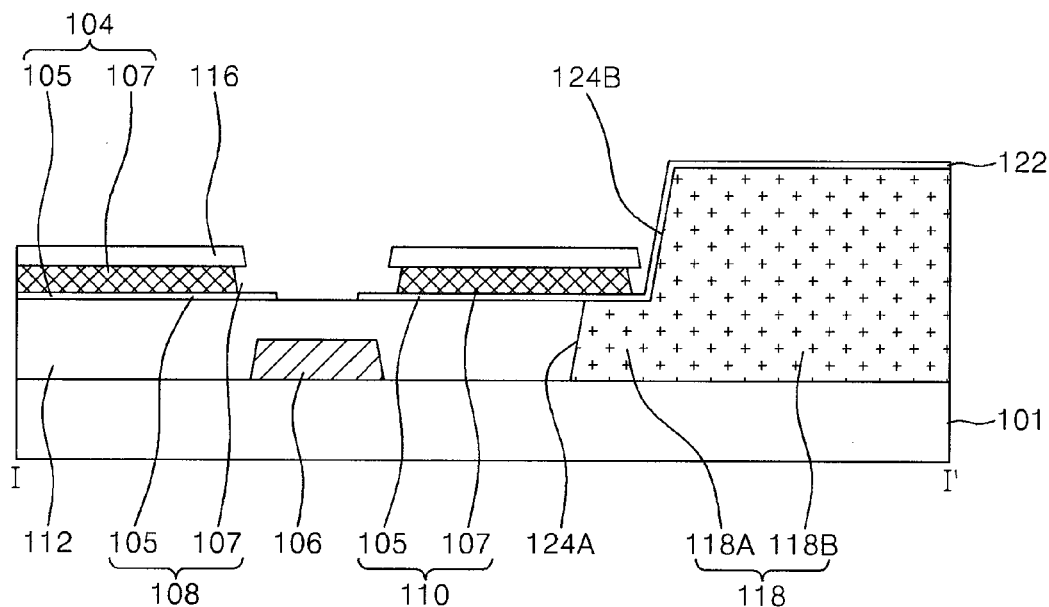

Then, as shown in FIG. 7C, the thickness of the second border insulating layer 116 with the first thickness h1 of FIG. 7B is made thinner by an ashing process such as one using an $O_2$ plasma, and the second border insulating layer 116 is thus reduced to the smaller second thickness h2. Unwanted portions of the second conductive layer 107 are removed by an etching process using as a mask the second border insulating layer 116 after it is ashed. At this time, the second conductive layer 107 of the source and drain electrodes 108, 110 is defined by self-laingment to have substantially the same width as that of the second border insulating layer 116 or it is overly etched to have a width narrower than that of the second border insulating layer 116.

Figure 7D:
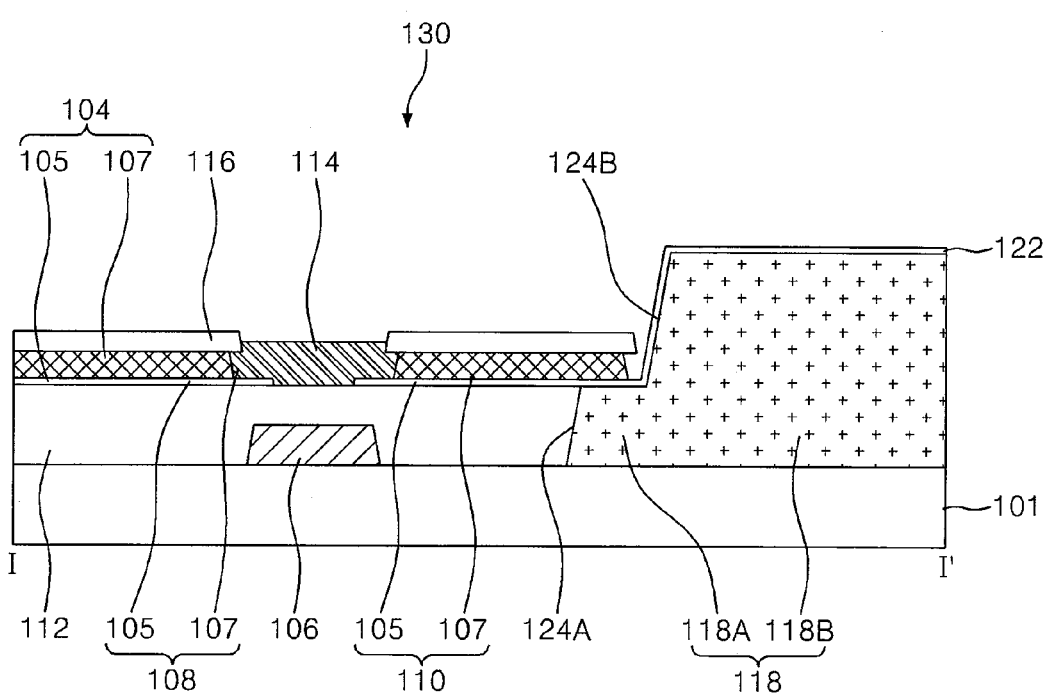

Then, an organic semiconductive solution is sprayed within the upper containment hole 124B as defined by the first border insulating layer 118 and by the second border insulating layer 116 using an ink-jet printing method. Then, the organic semiconductive solution is cured, and then a solid state of the organic semiconductive layer 114 is obtained as shown in FIG. 7D.

Meanwhile, before spraying the organic semiconductive solution, the source and drain metal patterns, the pixel electrode, and the lower substrate 101 on which the second border insulating layer 116 is formed are anodized. An area exposed through the upper containment hole 124B is thus given a hydrophilic property for encouraging whetting with the organic semiconductive solution, and a remaining area is left with a hydrophobic property so as to discourage whetting with the organic semiconductive solution due to the anodizing process. Then, when the organic semiconductive solution is sprayed on the lower substrate 101, it is concentrated on the gate insulating layer 112 having the hydrophilic property to thereby form the organic semiconductive layer 114. As a result, overflow of the organic semiconductive layer 114 is prevented.

Alternatively or additionally, if the first border insulating layer 118 is formed of a material having a hydrophobic property so as to discourage whetting with the organic semiconductive solution, the organic semiconductive solution is concentrated on the gate insulating layer 112, thereby preventing overflow of the organic semiconductive layer 114.

The organic semiconductive layer 114 may be so formed, and then treated by a Self Assembled Monolayer (SAM) process. Accordingly, the organic semiconductive layer 114 makes ohmic-contact with the source and drain electrodes 108, 110, respectively.

Figure 7E:
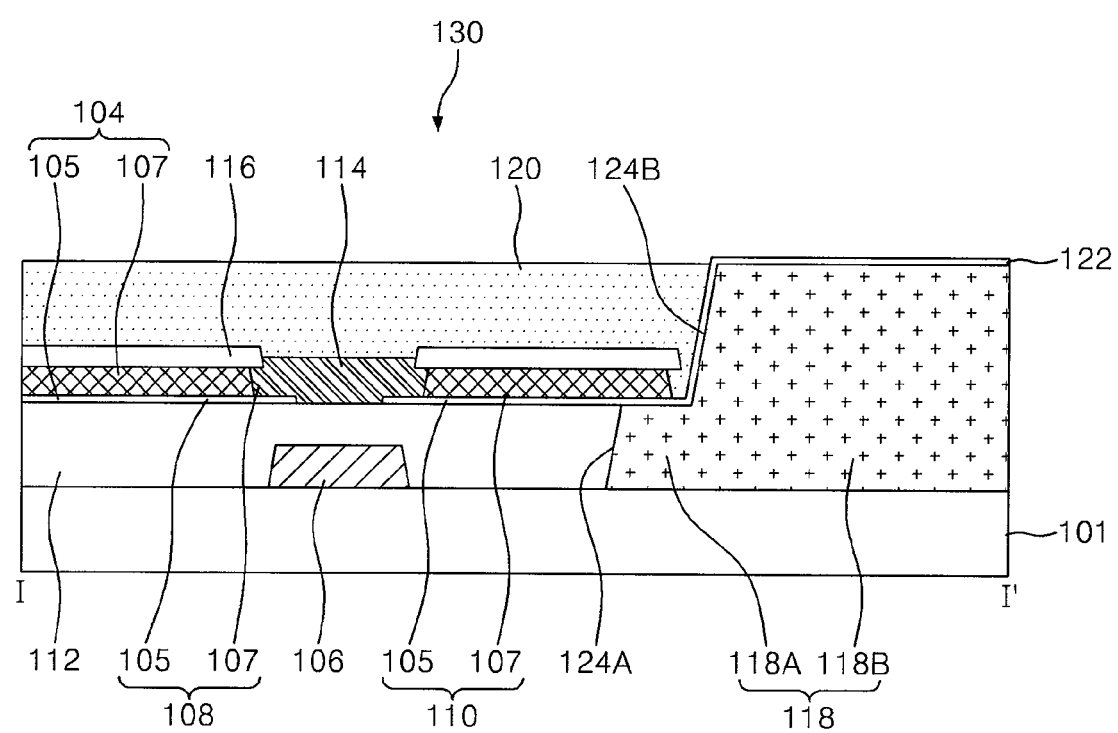

Then, an organic protective solution such as poly vinyl alcohol (PVA) is sprayed by an ink-jet printing method within the second sub-border insulating layer 118B and cured. Accordingly, the organic protective layer 120 may be formed within the upper containment hole 124B that is bounded by the upper border insulating sub-layer 118B, as shown in FIG. 7E.

Meanwhile, before spraying the organic protective solution, the lower substrate 101, on which the organic semiconductive layer 114 is formed, is anodized. An area exposed by the upper containment hole 124B has a hydrophilic property for encouraging whetting with the organic protective solution, and a remaining area has a hydrophobic property so as to discourage whetting with the organic protective solution due to the anodizing process. Then, if the organic protective solution is sprayed on the lower substrate 101, the organic protective solution is concentrated on an area having the hydrophilic property to form the organic protective layer 120. Accordingly, overflow of the organic protective layer 120 is prevented.

As described above, the method of manufacturing the organic thin film transistor substrate forms an organic gate insulating layer and an organic protective layer running parallel with the gate line within the first and second containment holes whose peripheries are defined at least partially by the first border insulating layer 118. Accordingly, the organic thin film transistor substrate and the method of manufacturing the organic thin film transistor substrate according to the present disclosure has a wider process margin for the ink-jet printing apparatus used in forming the organic gate insulating layer and the organic protective layer, respectively, thereby simplifying a manufacturing process.

While embodiments have been described in connection with what is presently considered to be practical, it is to be understood that the disclosure is not to be limited to the specifically disclosed embodiments, but, on the contrary, is intended to cover various modifications and equivalent arrangements included within the spirit and scope of the disclosure.

What is claimed is:

1. An organic thin film transistor substrate comprising:
a gate line formed on a substrate;
a data line which crosses with the gate line to define a pixel area;
an organic gate insulating layer interposed at least between a gate electrode defining portion of the gate line and a source electrode defining portion of the data line, where said gate electrode defining and source electrode defining portions are parts of a thin film transistor which further includes a drain electrode and an organic semiconductive layer;
a pixel electrode connected with the drain electrode of the thin film transistor and extending over a substantial portion of said pixel area;
an organic protective layer covering the organic semiconductive layer and peripheral other areas of the thin film transistor;
a first border-defining insulating layer that has a step-like contour for defining first and second containment holes into which materials of the organic gate insulating layer and of the organic protective layer may be filled, and
a second border-defining insulating layer formed on the source electrode portion and the drain electrode of the thin film transistor so as to further define the second containment hole into which the material of the organic semiconductive layer may be filled.

2. The organic thin film transistor substrate of claim 1, wherein the first border-defining insulating layer comprises
a first border insulating sub-layer which defines at least part of the border of the first containment hole as extending in parallel with the gate line, where the first containment hole defines a first void into which the organic gate insulating layer is filled; and
a second border insulating sub-layer which defines at least part of the border of the second containment hole as continuing from the first containment hole, where the second containment hole defines a second void into which the organic protective layer is filled.

3. The organic thin film transistor substrate of claim 2, wherein the first border-defining insulating layer includes fluorine-containing surface area.

4. The organic thin film transistor substrate of claim 2, wherein an area exposed by the first containment hole has a hydrophilic property with the organic gate insulating layer, and a remaining area has a hydrophobic property with the organic gate insulating layer.

5. The organic thin film transistor substrate of claim 2, wherein an area exposed by the second containment hole has a hydrophilic property with the organic protective layer, and a remaining area has a hydrophobic property with the organic protective layer.

6. The organic thin film transistor substrate of claim 1, wherein a channel area of the thin film transistor exposed by the second border insulating layer has a hydrophilic property with the organic semiconductive layer, and a remaining area has a hydrophobic property with the organic semiconductive layer.

7. The organic thin film transistor substrate of claim 1, wherein the source electrode and the drain electrode comprise
a first conductive layer formed of a transparent conductive layer, and
at least one layer of second conductive layer formed on the first conductive layer of a remaining area except for an area overlapping a gate electrode of the thin film transistor.

8. The organic thin film transistor substrate of claim 7, wherein the data line may be formed by extending the first conductive layer of the source electrode or depositing the first conductive layer and the second conductive layer, and
the pixel electrode may be formed by extending the first conductive layer of the drain electrode.

9. The organic thin film transistor substrate of claim 7, wherein the second border insulating layer may be formed to have the same width as that of the second conductive layer on the second conductive layer or to be wider than the width of the second conductive layer.

10. The organic thin film transistor substrate of claim 1, wherein the second border insulating layer may be formed of a photosensitive organic layer.

* * * * *